United States Patent
Jacobs

(10) Patent No.: US 9,994,441 B2
(45) Date of Patent: *Jun. 12, 2018

(54) OPTICAL ELECTRONIC DEVICE AND METHOD OF FABRICATION

(71) Applicant: TEXAS INSTRUMENTS INCORPORATED, Dallas, TX (US)

(72) Inventor: Simon Joshua Jacobs, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/339,149

(22) Filed: Oct. 31, 2016

(65) Prior Publication Data

US 2017/0044009 A1 Feb. 16, 2017

Related U.S. Application Data

(62) Division of application No. 14/574,937, filed on Dec. 18, 2014, now Pat. No. 9,481,572.

(Continued)

(51) Int. Cl.
*B81C 1/00* (2006.01)
*B81B 3/00* (2006.01)
(Continued)

(52) U.S. Cl.
CPC ........ *B81C 1/00317* (2013.01); *B81B 3/0083* (2013.01); *B81B 7/0067* (2013.01); *B81C 1/00595* (2013.01); *G02B 1/115* (2013.01); *G02B 26/0833* (2013.01); *B81B 2201/042* (2013.01); *B81B 2207/015* (2013.01); *B81C 1/00047* (2013.01); *B81C 1/00119* (2013.01); *B81C 1/00261* (2013.01); *B81C 1/00269* (2013.01); *B81C 2201/014* (2013.01); *B81C 2203/0109* (2013.01); *B81C 2203/0118* (2013.01); *B81C 2203/0127* (2013.01); *B81C 2203/0145* (2013.01); *B81C 2203/0735* (2013.01); *B81C 2203/0771* (2013.01)

(58) Field of Classification Search
CPC .. B81C 2203/0109; B81C 2203/00317; B81C 2203/00333; B81C 2203/0118; B81C 2203/0145; B81C 2203/0127; B81C 1/00269

See application file for complete search history.

(56) References Cited

U.S. PATENT DOCUMENTS 4,622,433 A * 11/1986 Frampton ............... H01L 21/50 174/521
6,100,108 A * 8/2000 Mizuno ............... B81C 1/00269 438/115

(Continued)

*Primary Examiner* — David Zarneke
(74) *Attorney, Agent, or Firm* — Michael A. Davis, Jr.; Charles A. Brill; Frank D. Cimino

(57) ABSTRACT

For an optical electronic device and method that forms cavities through an interposer wafer after bonding the interposer wafer to a window wafer, the cavities are etched into the bonded interposer/window wafer pair using the anti-reflective coating of the window wafer as an etch stop. After formation of the cavities, the bonded interposer/window wafer pair is bonded peripherally of die areas to the MEMS device wafer, with die area micromechanical elements sealed within respectively corresponding ones of the cavities.

7 Claims, 13 Drawing Sheets

Related U.S. Application Data

(60) Provisional application No. 62/025,904, filed on Jul. 17, 2014.

(51) Int. Cl.
  *G02B 26/08* (2006.01)
  *B81B 7/00* (2006.01)
  *G02B 1/115* (2015.01)

(56) References Cited

U.S. PATENT DOCUMENTS

| | | | |
|---|---|---|---|
| 6,252,229 B1 * | 6/2001 | Hays | B81C 1/00269 |
| | | | 250/338.4 |
| 6,630,725 B1 * | 10/2003 | Kuo | B81C 1/00269 |
| | | | 257/659 |
| 6,818,464 B2 * | 11/2004 | Heschel | G02B 6/4201 |
| | | | 257/E21.597 |
| 7,109,120 B2 | 9/2006 | Yang | |
| 7,118,234 B2 | 10/2006 | Pan et al. | |
| 7,160,478 B2 | 1/2007 | Leib et al. | |
| 7,160,791 B2 | 1/2007 | Yang | |
| 7,368,808 B2 * | 5/2008 | Heck | B81C 1/00269 |
| | | | 257/678 |
| 7,681,306 B2 * | 3/2010 | Heschel | B81B 1/004 |
| | | | 29/602.1 |
| 7,696,104 B2 | 4/2010 | Lee et al. | |
| 7,787,170 B2 | 8/2010 | Patel et al. | |
| 7,833,879 B2 | 11/2010 | Chen | |
| 7,968,986 B2 * | 6/2011 | Hovey | B81C 1/00317 |
| | | | 257/680 |
| 9,329,360 B2 | 5/2016 | Bakke et al. | |
| 9,481,572 B2 * | 11/2016 | Jacobs | B81C 1/00595 |
| 9,550,668 B1 * | 1/2017 | Xia | H01L 29/84 |
| 2004/0232535 A1 | 11/2004 | Tarn | |
| 2005/0262929 A1 | 12/2005 | Felton et al. | |
| 2006/0046430 A1 | 3/2006 | Yang | |
| 2006/0267109 A1 | 11/2006 | Ohguro | |
| 2006/0281227 A1 | 12/2006 | Yang | |
| 2007/0029562 A1 | 2/2007 | Koizumi | |
| 2010/0019340 A1 | 1/2010 | Shibayama | |
| 2011/0101484 A1 | 5/2011 | Shiraishi et al. | |
| 2015/0298968 A1 | 10/2015 | Lushan et al. | |

* cited by examiner

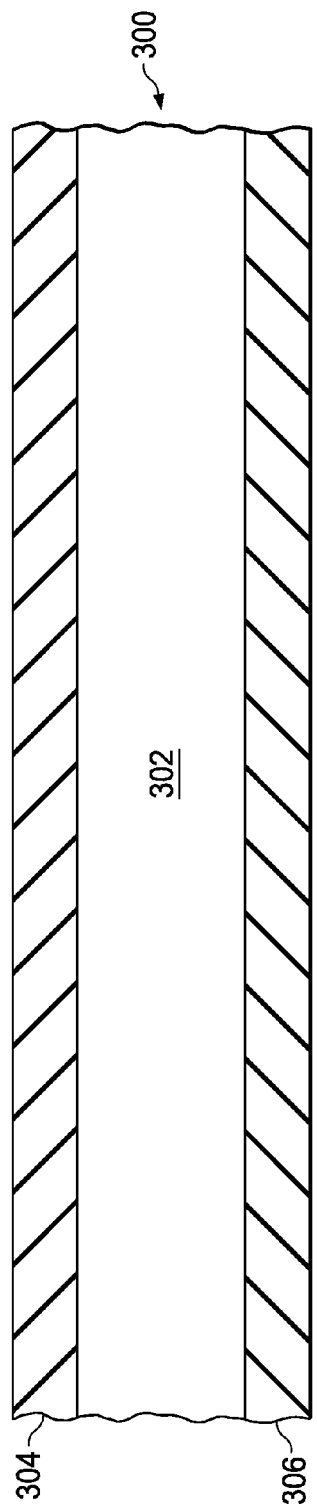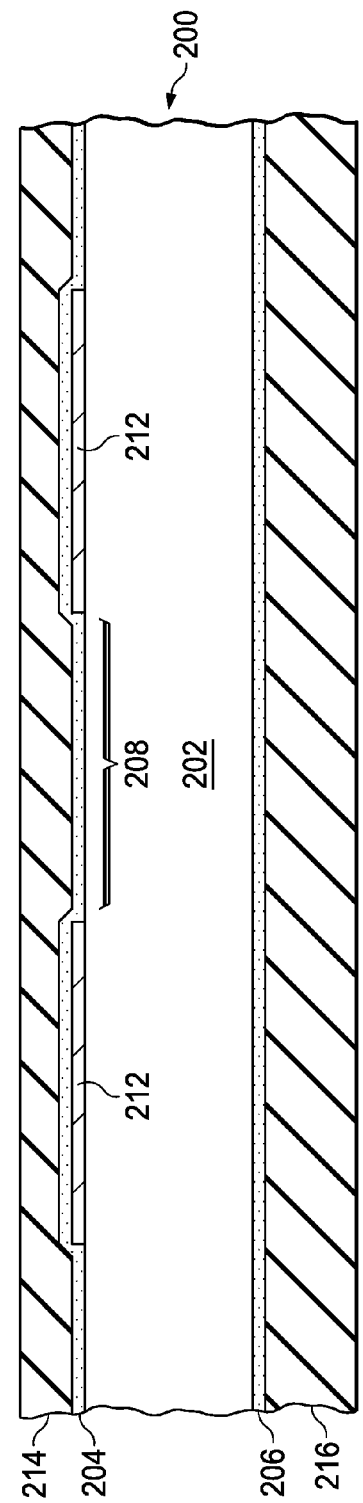

OPTICAL ELECTRONIC DEVICE AND METHOD OF FABRICATION

CROSS-REFERENCE TO RELATED APPLICATIONS

This application is a divisional of U.S. patent application Ser. No. 14/574,937 filed Dec. 18, 2014, which claims the benefit of priority under 35 U.S.C. § 119(e) of U.S. Provisional Application 62/025,904, filed Jul. 17, 2014, both of which are hereby fully incorporated herein by reference in their entirety.

TECHNICAL FIELD

This relates to optical electronic devices, such as packaged microelectromechanical system (MEMS) devices and methods of fabrication.

BACKGROUND

Microelectromechanical system (MEMS) devices typically include integrated circuitry or similar microelectronic elements along with micromechanical elements controlled by or otherwise communicated or interacted with the microelectronic elements. The micromechanical elements are generally formed utilizing photolithography, material deposition, etching and other fabrication processes which may be the same as or similar to those used for forming the associated integrated circuitry. Example MEMS devices include temperature sensors, pressure sensors, accelerometers, microswitches, micromirror spatial light modulators, and vibration responsive energy harvesters. Because the micromechanical elements are usually very sensitive and may be damaged or degraded by uncontrolled exposure to their operating environments, such devices typically require protective packaging. For applications requiring protection against moisture intrusion, hermetically sealed packaging is used to contain the micromechanical and associated microelectronic elements.

A MEMS device such as a Texas Instruments DLP® digital micromirror device (DMD), for example, has micromechanical elements that take the form of micromirrors located at pixel positions in arrays. The micromirrors are individually settable to "ON" or "OFF" orientations responsive to electric fields applied by microelectronic elements formed by CMOS processes at corresponding pixel positions in underlying memory cell arrays. To protect the mirrors, the micromirror arrays are located within cavities formed between the MEMS dies and light transparent covers. In order to benefit from economies of scale, at least some of the packaging steps are performed at wafer level, with a window wafer bonded to the die wafer prior to singulation.

In one packaging approach, an interposer wafer is inserted between the window wafer and the die wafer. The interposer is pre-formed with openings that define cavities to receive and surround the micromechanical components and acts as a spacing structure between the cover window and the MEMS device die. The window wafer is pre-manufactured to specified optical performance requirements relating to, for example, wavelengths to be transmitted, wavelengths to be blocked, aperture sizing, and anti-reflective (AR) coating material. For packaged MEMS devices like the DMDs, the interposer wafer is bonded to the MEMS wafer and the window wafer is bonded to the interposer wafer to form and maintain a seal while providing an optically suitable window for interaction between the micromirrors and the outside environment.

Formation of a cavity between interposer and substrate requires repeatable control of material removal processes, especially in a manufacturing environment. Strategies to use sourced material, such as pre-manufactured glass for lid substrate wafers, reduce cost while improving process manufacturability and repeatability.

Examples of prior approaches to fabricating packaged MEMS devices are given in U.S. Pat. Nos. 7,109,120; 7,118,234; 7,160,791; 7,787,170 and 7,833,879; the entireties of all of which are incorporated herein by reference.

SUMMARY

An approach to optical electronic device packaging is described which includes selective removal of material from one wafer of a bonded wafer pair. The method reduces fabrication steps by bonding together material to be removed from one wafer with an etch stop on its partner wafer.

In one aspect, a method of fabricating an optical electronics device includes providing a first wafer having a semiconductor substrate with a first dielectric layer formed over a first surface of the semiconductor substrate and providing a second wafer having a transparent substrate with an anti-reflective coating formed over a first surface of the transparent substrate. A first oxide layer is formed over the anti-reflective coating. The first oxide layer of the second wafer is bonded to the first wafer on a side of the first wafer opposite the first dielectric layer. Portions of the first dielectric layer are removed down to the semiconductor substrate to define first ends for the cavity. Portions of the semiconductor substrate are selectively etched down to the first oxide layer to define the cavity through the semiconductor substrate. The first oxide layer is selectively etched down to the anti-reflective coating to define second ends of the cavity, the anti-reflective coating serving as an etch stop relative to an etchant used to etch the first oxide layer.

The described approach enables the use of a standard anti-reflective (AR) coated window wafer to create a hermetic window assembly in a cost-effective manner.

BRIEF DESCRIPTION OF THE DRAWINGS

FIGS. 4A-4K are cross-sectional views illustrating details of steps in an example fabrication method like that shown in FIGS. 2 and 3.

DETAILED DESCRIPTION OF EXAMPLE EMBODIMENTS

Figure 1:
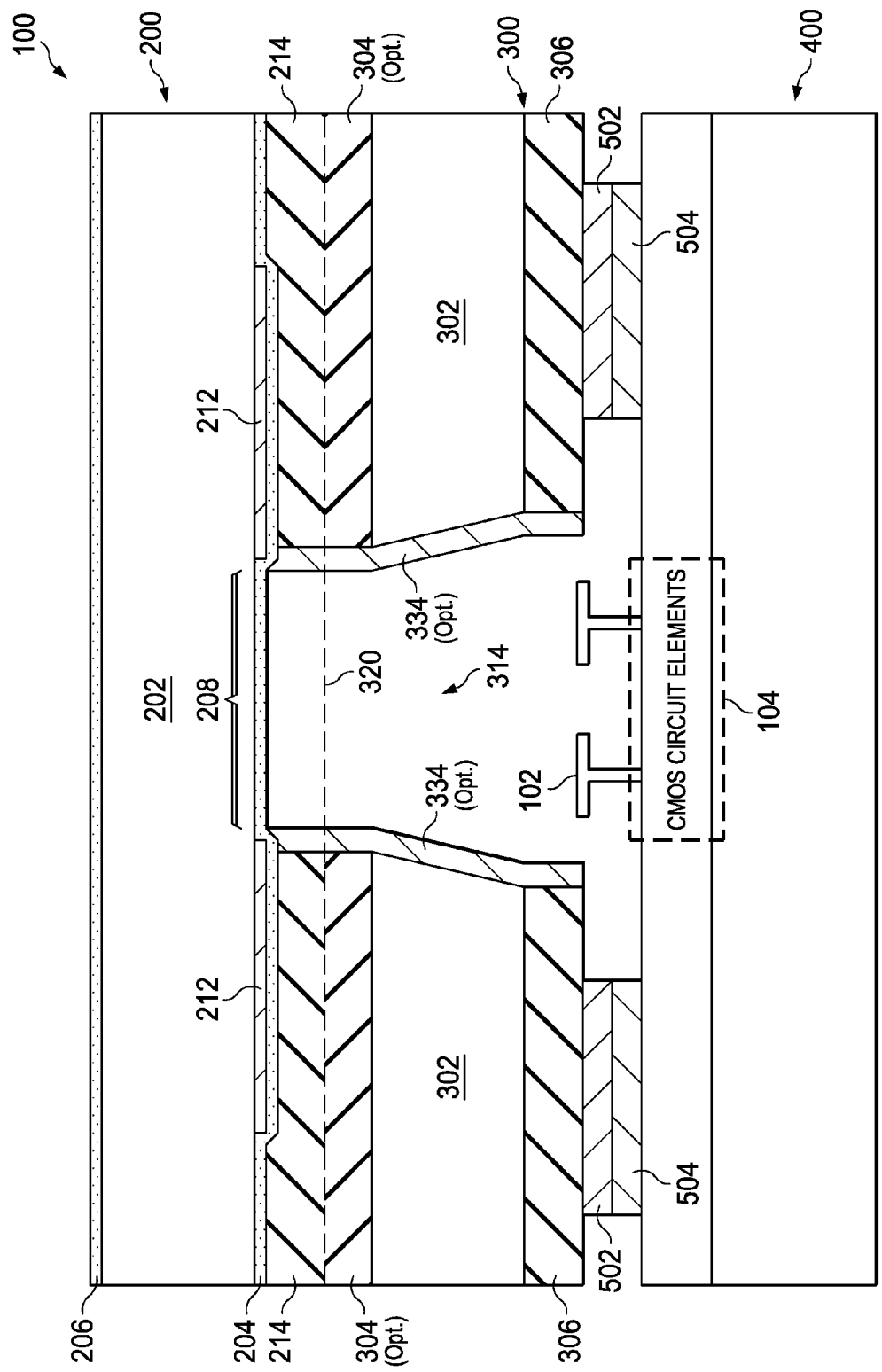
FIG. 1 is a cross-sectional view of an example optical electronics device.

FIG. 1 illustrates an example optical electronics device 100 resulting from a fabrication method in which a cover or window wafer 200 bonded to a semiconductor interposer wafer 300 is bonded to a MEMS device wafer 400, then singulated. The example optical electronics device 100 may be a packaged MEMs device such as a digital micromirror device (DMD) having micromirror micromechanical elements 102 formed over associated CMOS fabricated integrated circuit microelectronic elements 104 at respective die areas of MEMS device wafer 400 (elements 102, 104 shown only schematically).

Window wafer 200 has a transparent substrate 202 with top and bottom surfaces coated with anti-reflective coating (ARC) layers 204, 206. Transparent substrate 202 may be glass, quartz, or other material that allows for transmission of electromagnetic radiation. Wafer 200 optionally includes a chrome or other opaque material layer 212 patterned to define a window aperture 208 over elements 102 at each die area location. Patterned layer 212 underlies ARC layer 204. Window wafer 200 is bonded (e.g., fusion bonded or direct bonded) to interposer wafer 300 at a silicon dioxide layer 214 formed over layer 204, as indicated by dashed lines in FIG. 1.

Interposer wafer 300 has a silicon semiconductor substrate 302 with a dielectric layer 306 formed on a bottom surface. An optional silicon dioxide layer 304 may be formed on a top surface of the semiconductor substrate 302. If layer 304 is included, both layers 304 and 306 may comprise silicon dioxide layer. If layer 304 is not included, dielectric layer 306 may comprise silicon dioxide, silicon nitride, or some other etch resistant dielectric material. A top side of interposer wafer 300 opposite dielectric layer 306 is bonded to window wafer 200 at silicon dioxide layer 214 (see bond 320 indicated by dashed lines in FIG. 1). One or more bonding layers 502 may be formed on bottom surfaces of interposer wafer 300 for bonding to corresponding one or more bonding layers 504 formed peripherally of micromechanical elements 102 on upper surfaces of MEMS device wafer 400.

The bonded structure 100 (comprising a singulated die area of bonded wafers 200, 300, 400) includes a cavity 314 enclosing micromechanical elements 102 at the die area. Cavity 314 has one end defined by a top surface area of MEMS device wafer 400 containing elements 102 and circumferentially surrounded by joined bonding layers 502, 504. An opposite end of cavity 314 is defined by a top surface area of window wafer 200 providing an exposed area of ARC layer 204 forming aperture 208 and circumferentially surrounded by sidewalls of an opening formed through layer 214. A main part of cavity 314 is defined by a hole through interposer wafer 300 circumferentially surrounded by sidewalls of openings formed through each of optional oxide layer 304, silicon substrate 302, and oxide layer 306. The sides of the opening through substrate 302 are sloped inwardly in the direction of aperture 208. The sidewalls of the opening through layer 214 and the hole through interposer wafer 300 are may be metallized by an optional metal layer 334 which assists in establishing a hermetic seal for the contained elements 102.

Figure 2:
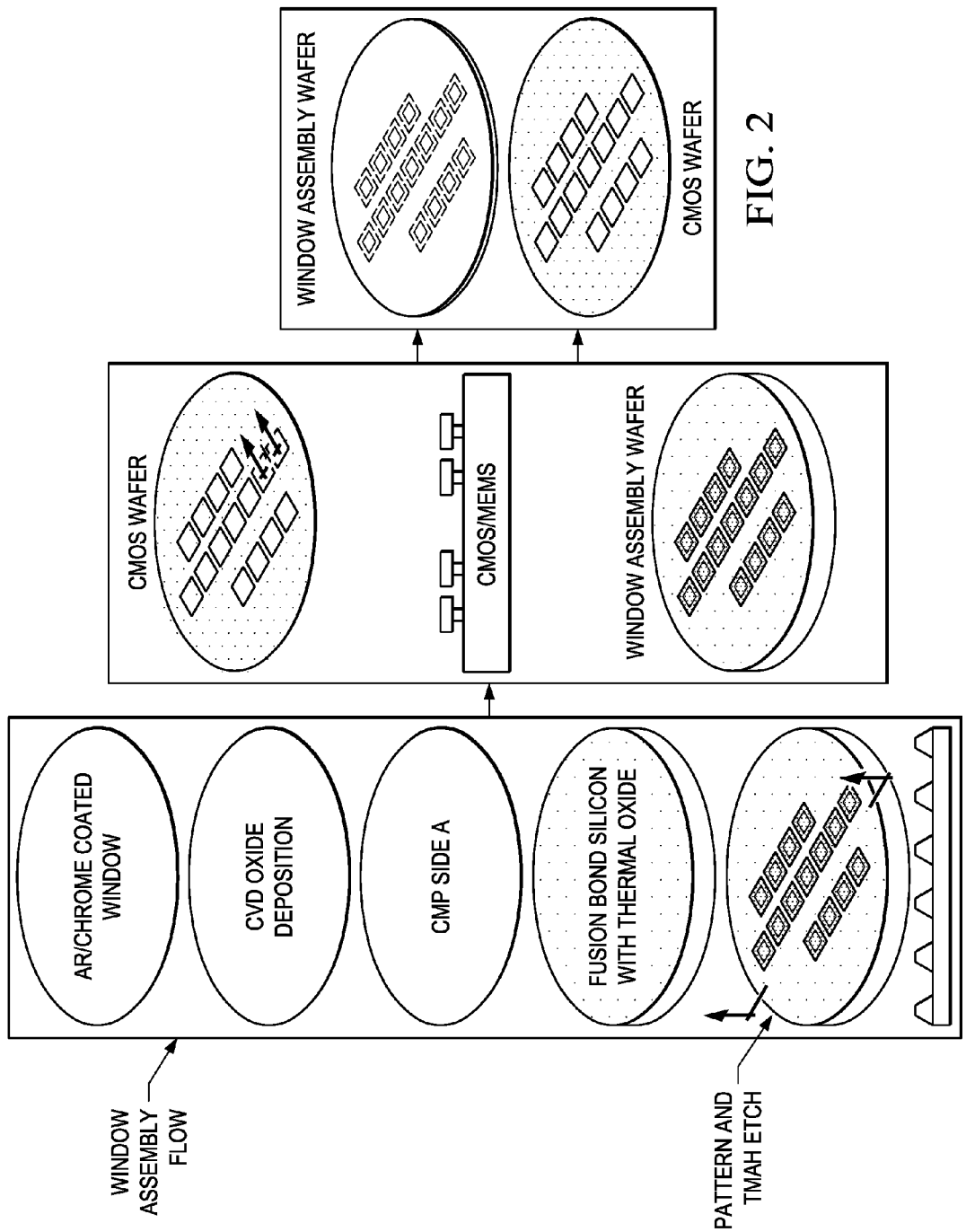
FIGS. 2 and 3 are overall flow and flow chart diagrams for an example flow for the fabrication of an assembly like that of the optical electronics device shown in FIG. 1
Figure 3:
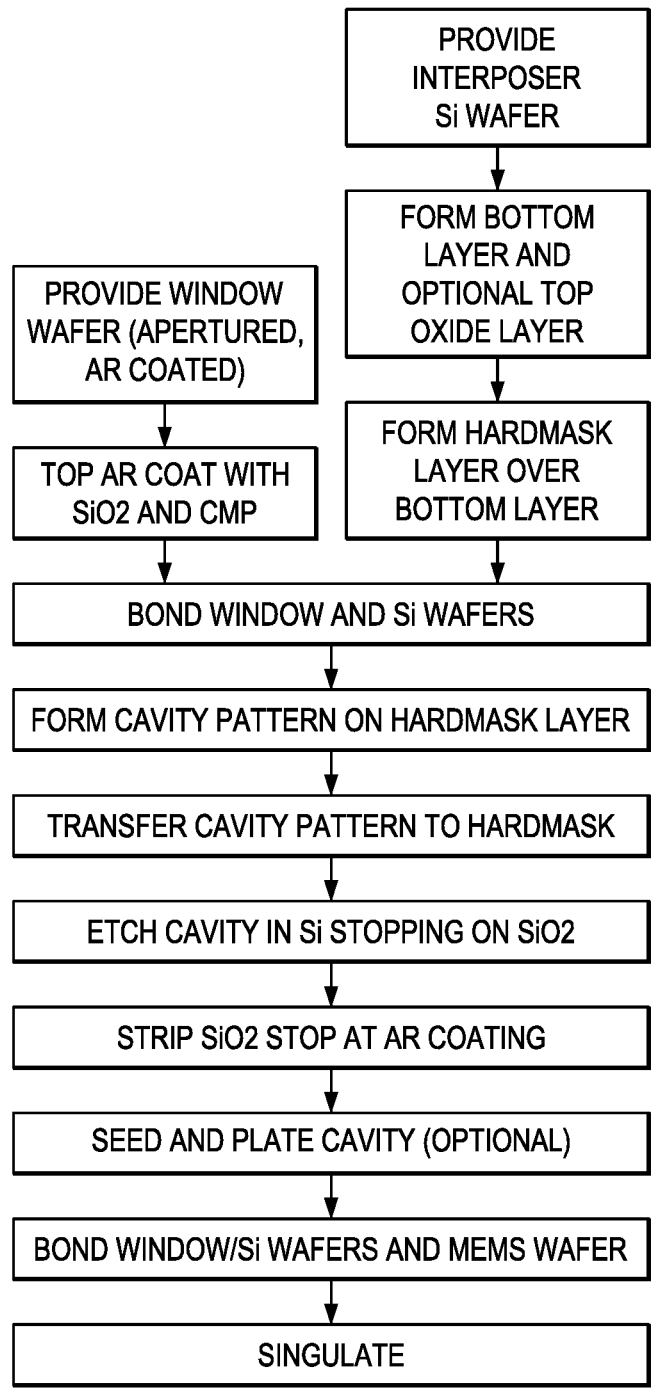

FIGS. 2 and 3 summarize an example flow for the fabrication of an assembly like the optical electronics device shown in FIG. 1. FIGS. 4A-4K illustrate more details of steps in the example flow.

The example flow is described in the context of a specific example embodiment for the fabrication of packaged MEMS devices such as digital micromirror devices (DMDs) having micromirror micromechanical elements 102 formed in arrays over associated SRAM cell microelectronic elements 104 arranged in corresponding arrays at respective die areas of a CMOS integrated circuit wafer 400. Similar steps may be applied for the fabrication of other optical electronics devices.

The example process involves etching a bonded wafer pair where the etch stop is buried under the bonding oxide. The bonded wafer pair comprises an interposer wafer and a window wafer which is transparent to at least some wavelengths of electromagnetic radiation at wavelengths of 400 nm to 20,000 nm. In specific cases, the etch stop may be a metal fluoride. The etch stop layer may be the terminal layer of an antireflection coating.

In contrast to previous approaches (see, e.g., the pre-patterned silicon interposer described in previously referenced U.S. Pat. Nos. 7,109,120; 7,118,234; 7,160,791 and 7,833,879), the example approach bonds a completed window wafer to a mechanical spacer interposer wafer and then forms pockets or cavities, taking advantage of the thin film structure to stop etches appropriately. Prior approaches have bonded the window to a pre-pocketed interposer. Forming the pockets after bonding the interposer and the window wafers enables inexpensive bulk and low temperature bonding processes to be used, thereby lowering total cost of assembly.

FIG. 4A shows an interposer wafer 300 usable for providing a cavity defining spacer and supporting structure for the wafer scale hermetic packaging of MEMS devices having microelectronic and micromechanical elements 102, 104 formed using integrated circuit fabricating techniques. The core of interposer wafer 300 may be a double-side polished, high resistivity (>10 Ohms/cm) CZ prime (100) silicon substrate 302 having, for example, an about 500μ thickness. Dielectric layer 306 is formed on a bottom surface of substrate 302. An optional oxide layer 304 may be formed on a top surface of substrate 302. If both dielectric layer 306 and oxide layer 304 are present, dielectric layer 306 and oxide layer 304 comprises silicon dioxide layer and are thermally grown by oxidizing (or, if preferred, are deposited using a CVD or other deposition process) to a thickness of about 1,000 Å to 1μ over each of top and bottom surfaces of the substrate 302. If oxide layer 304 is not included, dielectric layer 306 may alternatively comprise silicon nitride or other etch resistant dielectric. In preparation for wafer-to-wafer bonding the interposer and window wafers, top optional oxide layer 304 may be subjected to a CMP polish.

Figure 4B:
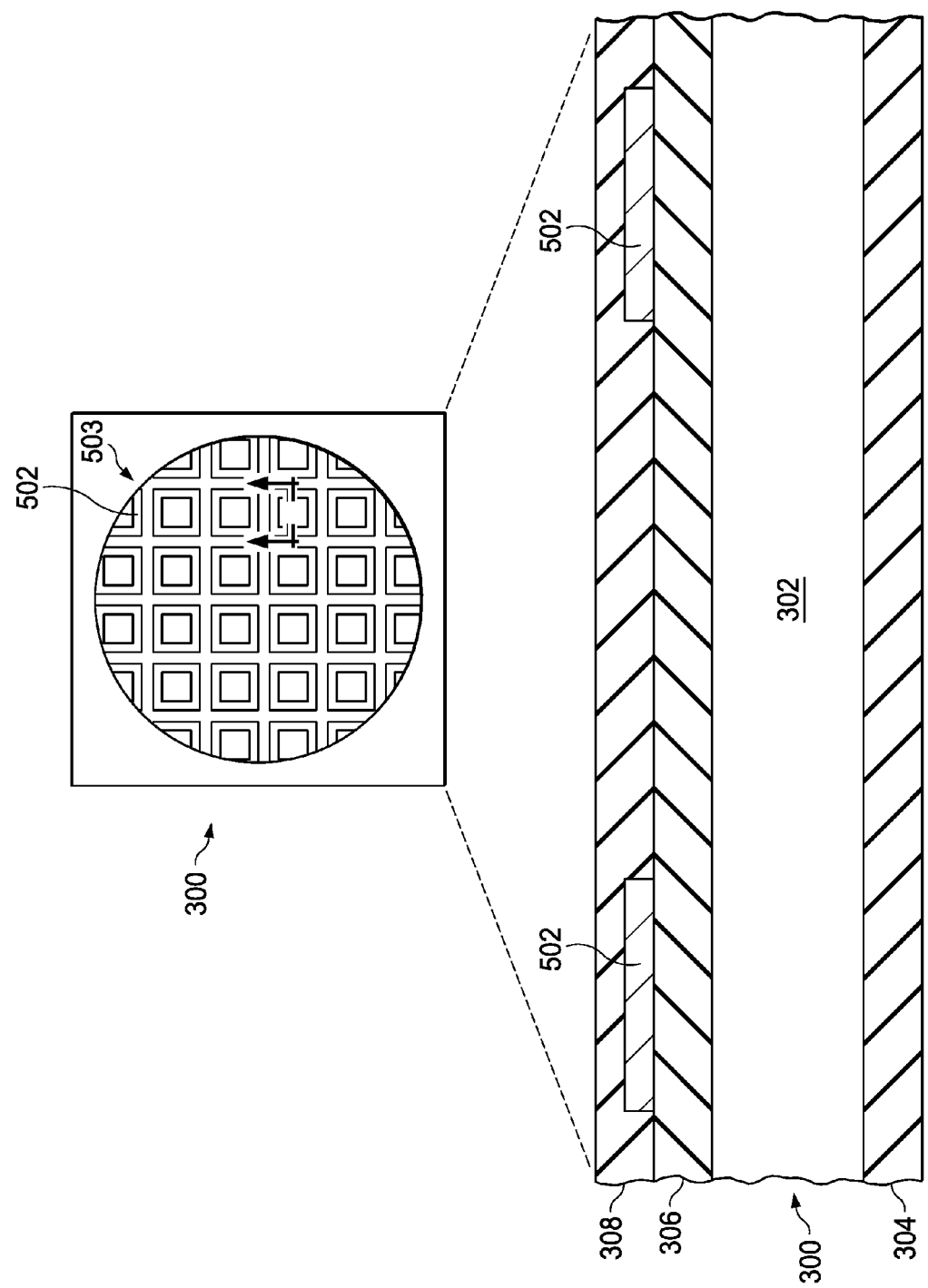

FIG. 4B illustrates the formation of one or more layers 502 of sealing material over the dielectric layer 306 on interposer wafer 300 in preparation for later joining the bottom surface of interposer wafer 300, after bonding to window wafer 300, to MEMS wafer 400. The one or more sealing material layers 502 are patterned into a grid configuration 503 (inset FIG. 4B) corresponding to a matching grid formation of one or more layers 504 (FIG. 1) of sealing material formed at locations peripherally surrounding mechanical elements 102 of respective die areas on MEMS wafer 400. (See, for example, peripheral metallization bonding layer 172A deposited on light absorbing metallic layer 170 for bonding glass substrate 116 to corresponding peripheral metallization bonding layer 172B of semiconductor substrate 114 in previously referenced U.S. Pat. No. 7,787, 170). A hardmask layer 308 of oxide hardmask material is blanket deposited over the patterned one or more sealing layers 502, over the dielectric layer 306.

Figure 4C:
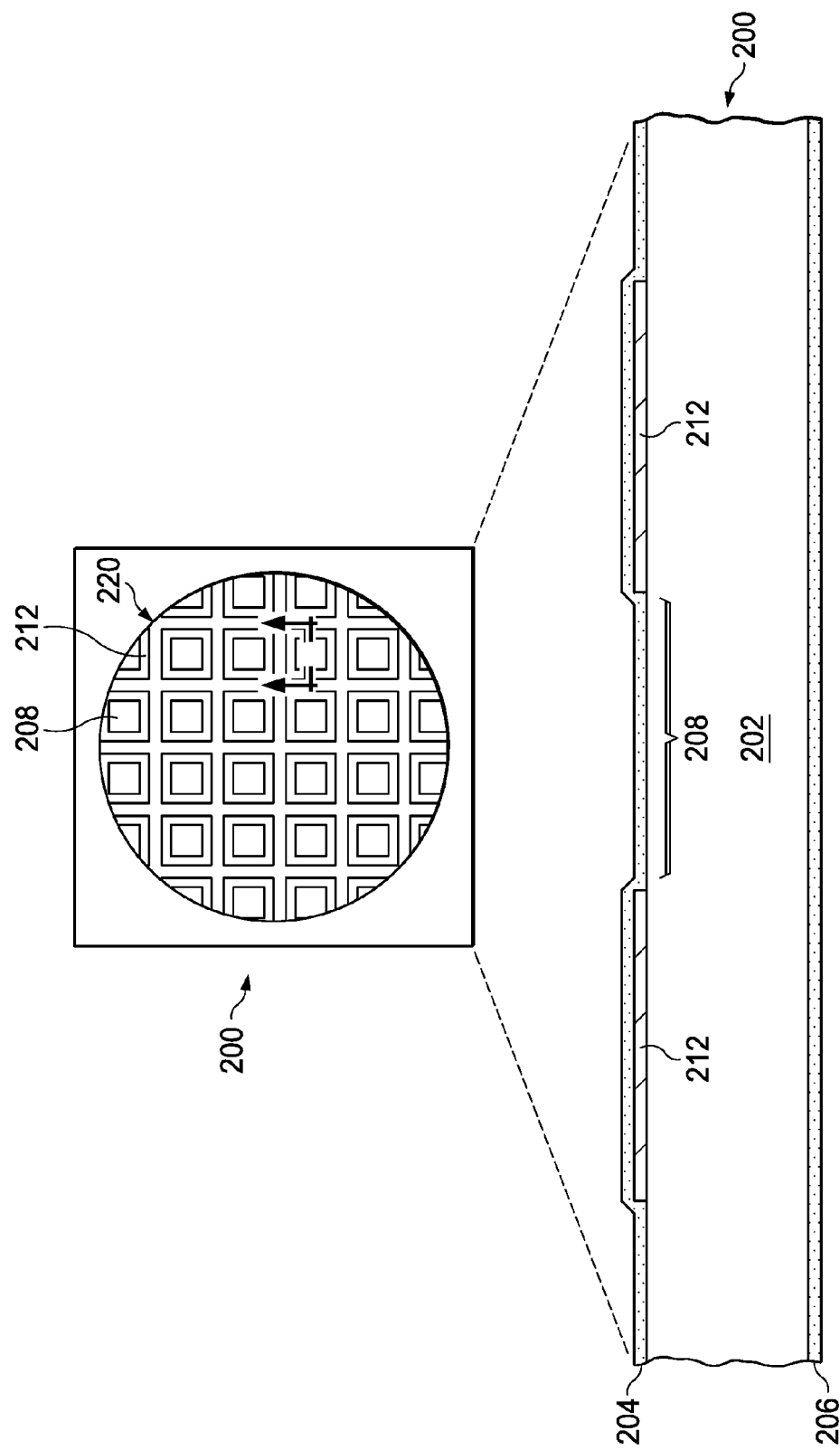

FIG. 4C shows a cover or window wafer 200 having a glass, quartz or other transparent material (such as one that allows for the transmission of electromagnetic radiation) substrate 202 whose top surface is coated with an anti-reflective coating (ARC) layer 204 and whose bottom surface is coated with an ARC layer 206. Window wafer 200 optionally includes a chrome or other opaque material layer 212 formed on the upper surface before deposition of ARC layer 204 and patterned to define window apertures 208 in a grid formation 220 at positions aligned with corresponding positions of MEMS element (viz., micromirror array) 102 die areas of a MEMS wafer 400 (FIG. 1). A suitable window wafer 200 usable in fabricating packaged DMD devices may be a 1050μ thick, AR coated borosilicate glass wafer having a dark chrome aperture grid patterned under the AR coating 204 on an upper surface thereof. Optical properties of wafer 200 should correspond to optical properties appropriate for the intended example optical MEMS device.

ARC layer 204 may comprise multiple ARC layers of, e.g., about 0.28μ total thickness blanket deposited over a patterned thin film chrome layer 212 of, e.g., about 0.16μ thickness. The top AR coating of ARC layer 204 may be an alkaline earth Group I or II metal fluoride or, optionally, a lanthanide or actinide metal fluoride. Suitable materials include magnesium fluoride ($MgF_2$), yttrium fluoride ($YF_3$) and ytterbium fluoride ($YbF_3$). A layer of $Al_2O_3$ may be included. The top layer material will serve not only as an AR coating but also as an etch stop for selective etching of interposer wafer 300, as further described below. ARC layer 206 may have a similar composition to ARC layer 204.

As shown in FIG. 4D, in preparation for bonding window wafer 200 to interposer wafer 300, an oxide layer 214 is deposited over ARC layer 204 and planarized to provide a suitable bonding surface. Deposition may be effected, for example, using a Silox or other PECVD process employing silane and nitrous oxide to establish a silicon dioxide layer 214 of about 1-1.4μ (e.g., 1.2μ) thickness. Subsequent planarity may be accomplished using CMP or other planarization (e.g., to meet <200 Å step height fusion bonding or other specification) leaving a remaining oxide layer 214 thickness of, e.g., about 0.6μ. A similar oxide layer 216 may optionally be deposited over ARC layer 206 (not thinned by planarization) to provide protection to the back surface of wafer 200 during handling and fabrication.

Figure 4E:
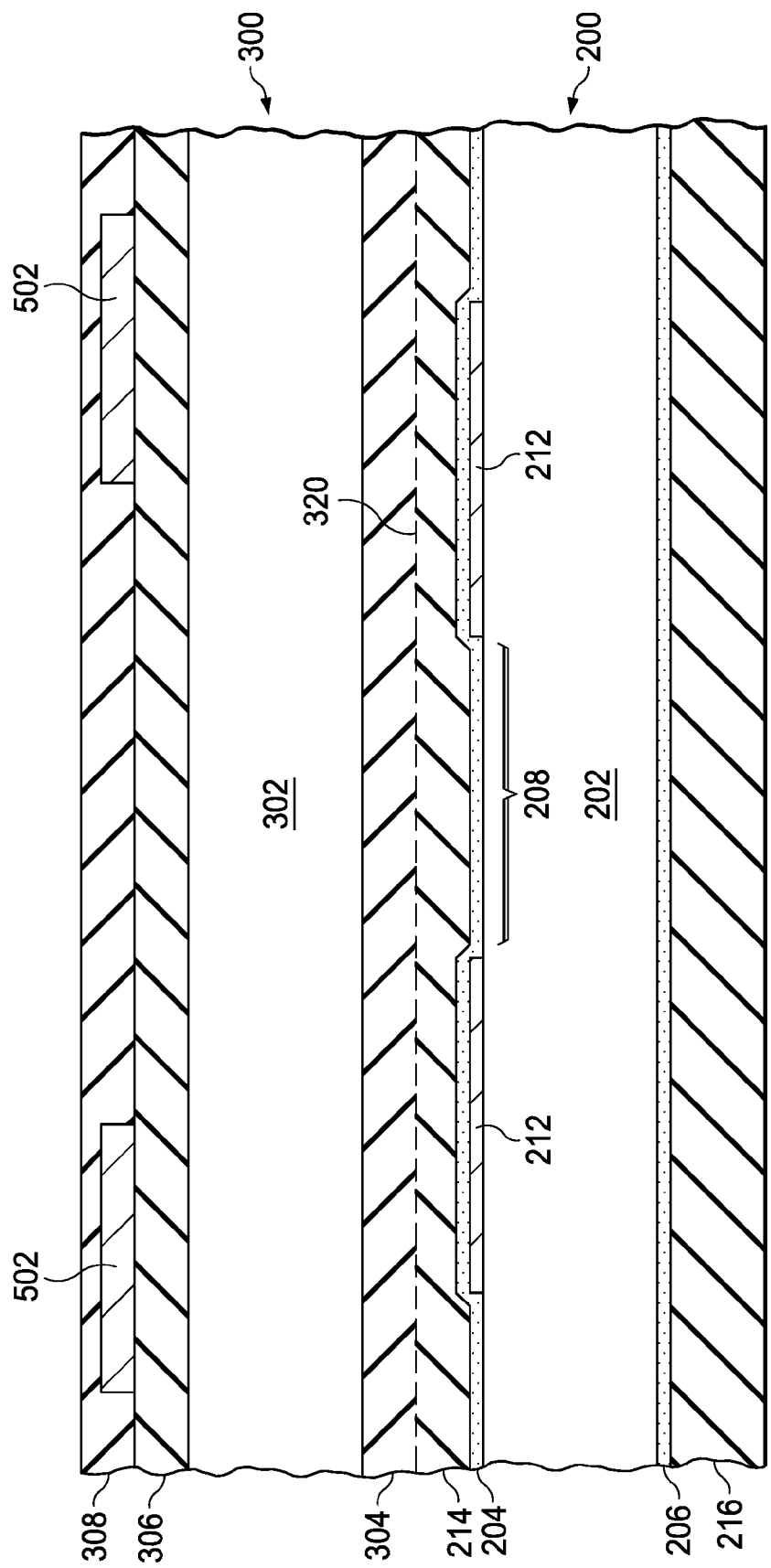

Following the preparation, as shown in FIG. 4E, the planarized oxide layer 214 side of window wafer 200 is bonded (as indicated by dashed line 320) to the top surface of interposer wafer 300 (for example, to optional oxide layer 304). This may be done, for example, using a plasma activated low temperature (≤400° C.) wafer-to-wafer fusion bonding process conducted, for example, at about room temperature or so (e.g., at 15-35° C.). The fusion bonding process may be followed by a post-bond anneal conducted, for example, at about 200-300° C. (e.g., 250° C.) for one to several hours.

Figure 4F:
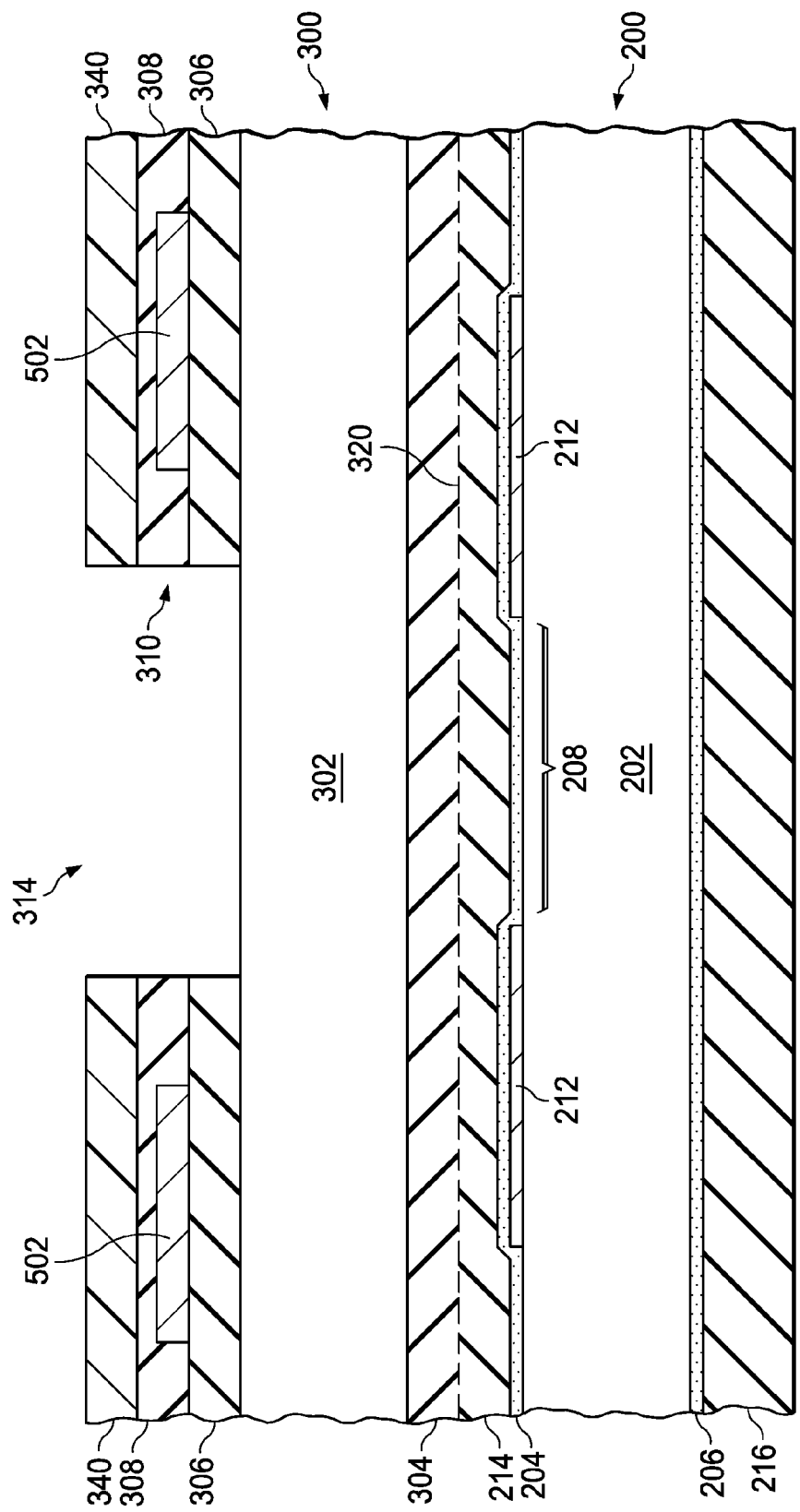

Next, as shown in FIG. 4F, a layer of photoresist 340 is formed (e.g., spin coated) over hardmask layer 308 on the bottom of interposer wafer 300 (note: top of interposer wafer 300 is bonded to top of window wafer 200 in FIG. 4E), and standard photolithography patterning and developing techniques are applied to pattern photoresist layer 340 to form a mask defining bottom openings 310 of cavities 314 for containment of micromechanical elements 102 at the respective die locations (viz., micromirror arrays at respective DMD die areas) of the MEMS wafer 400 to be subsequently bonded (see FIG. 1). A hardcoat etch is then performed to remove portions of the hardmask layer 308 to transfer the bottom opening pattern 310 from the developed photoresist layer 340 to the hardmask layer 308. This is followed by etching portions of dielectric layer 306 down to the silicon 302 to form first opening ends of cavities 314. This etch may be accomplished, for example, using a fluorocarbon dry etch and/or a buffered oxide ($NH_4F/HF$ mixture) wet etch, followed by a resist strip and clean-up.

Figure 4G:
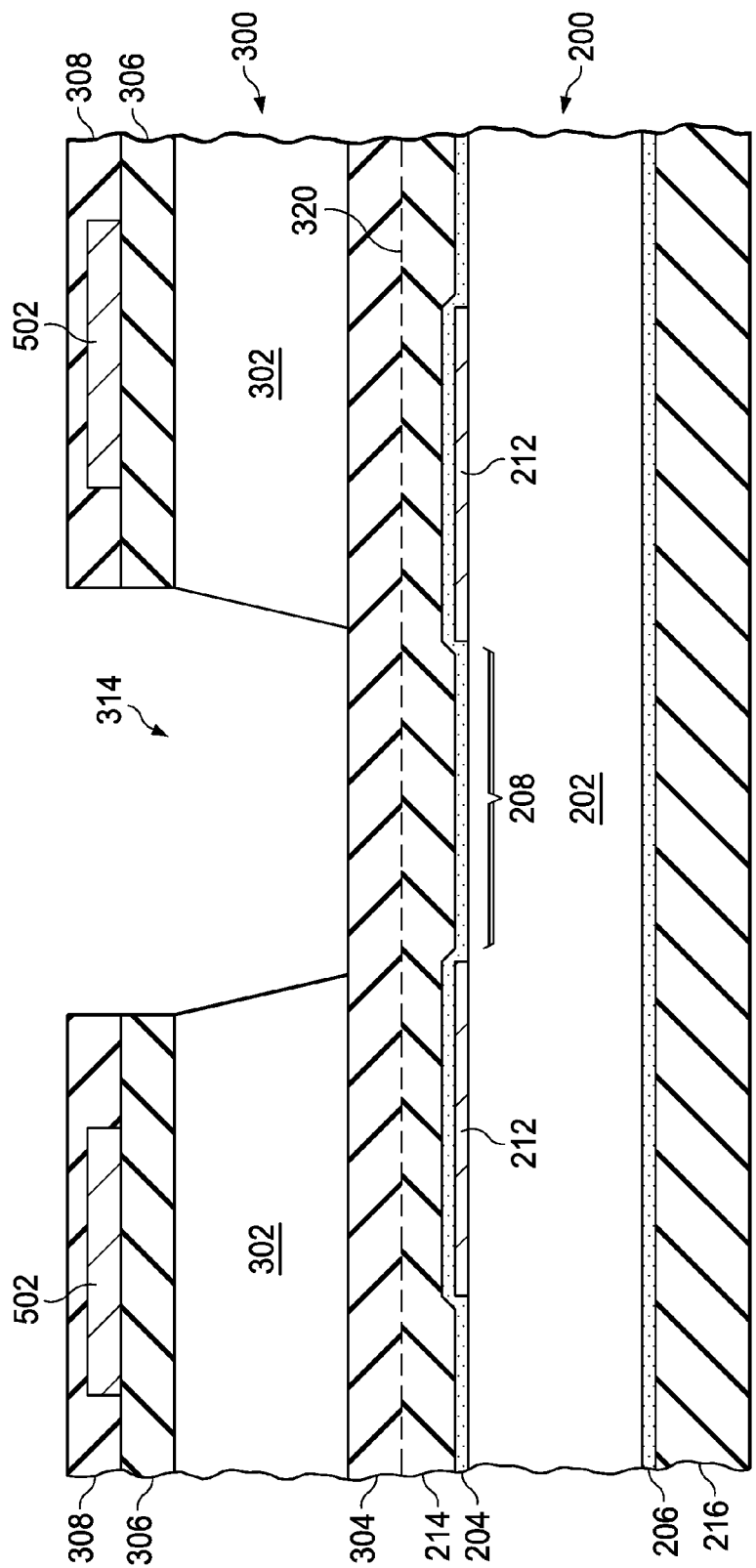

Next, as shown in FIG. 4G, an anisotropic etch is performed to selectively remove portions of the silicon from substrate 302 and deepen the cavities 314 down to the buried oxide layer 304, if present, using the patterned oxide hardmask material layer 308 as a mask. If optional layer 304 is not included, the oxide layer 214 functions as the etch stop. An example suitable etchant for this purpose is tetramethylammonium hydroxide (TMAH) which may be used alone or optionally in combination with a dry reactive-ion etch. The example etch defines cavity sidewalls that slope outwardly in the direction away from apertures 208 (inwardly in the downward direction in FIG. 4G).

Figure 4H:
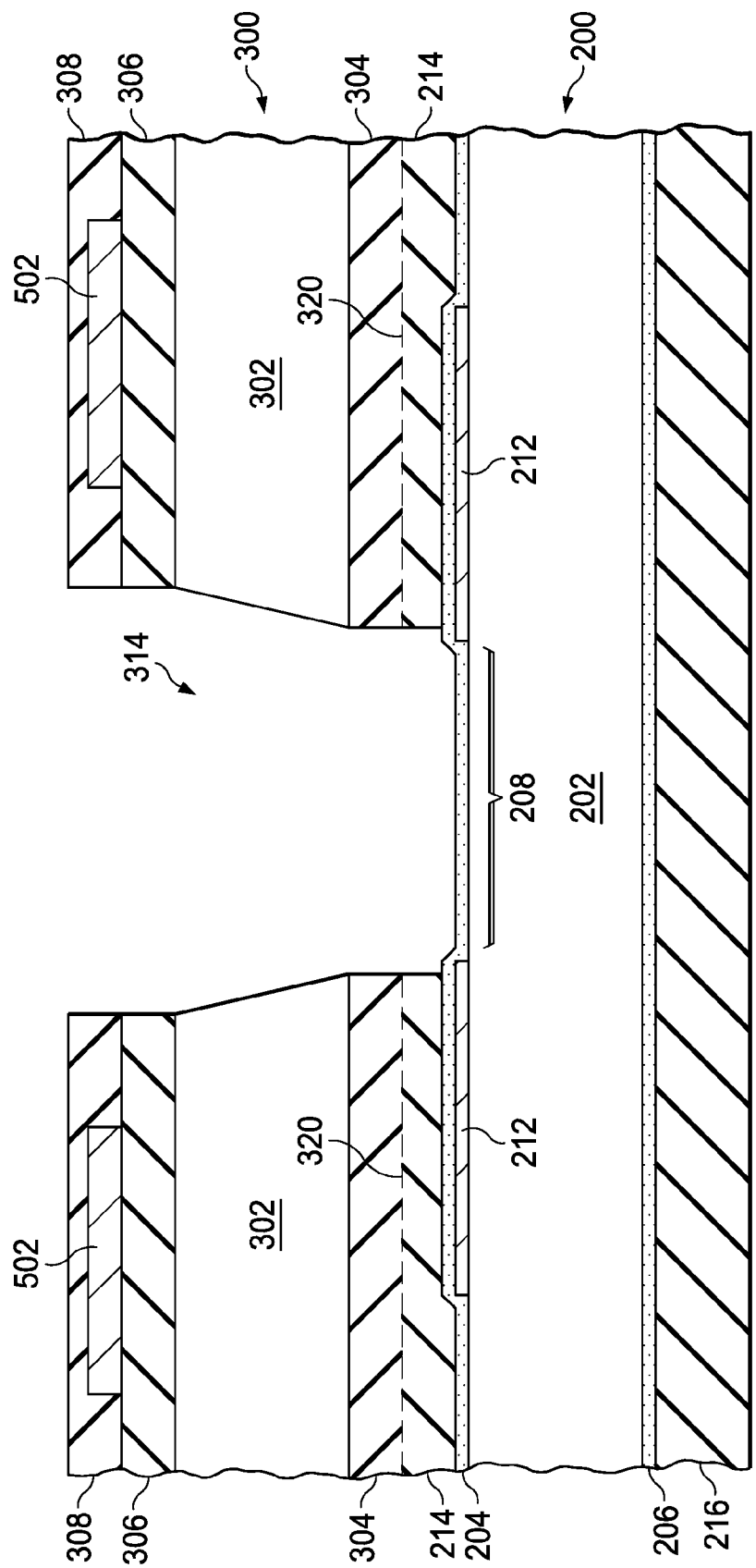

Thereafter, as shown in FIG. 4H, further etching is applied to selectively remove oxide exposed at the inside ends of cavities 314 to further expand the cavities 314 through oxide layers 304, 214, stopping on ARC layer 204 which acts as an etch stop. The oxide etch may use, for example, a fluorocarbon dry etch and/or a buffered oxide ($NH_4F/HF$ mixture) wet etch. The dry etch may, for example, be a fluorocarbon oxygen plasma.

FIG. 4H illustrates the bonded interposer/window wafer assembly 200/300 with hardmask layer 308 over dielectric layer 306 and all or portions of layers 306 and 216 still present. Thicknesses, compositions and/or number of layers of layers 306, 308, 216 may however be varied and the various etch processes controlled according to individual needs and preferences so that some or all of layers 306, 308, 216 remain in place unless or until subsequent removal at a desired point in the fabrication process. In the example, layers 216, 308 are sacrificial layers configured to respectively protect the unbonded sides of wafers 200 and 300 during at least a majority of the early steps in the fabrication procedure. Additional oxide and/or other sacrificial material layers may also be utilized.

Figure 4I:
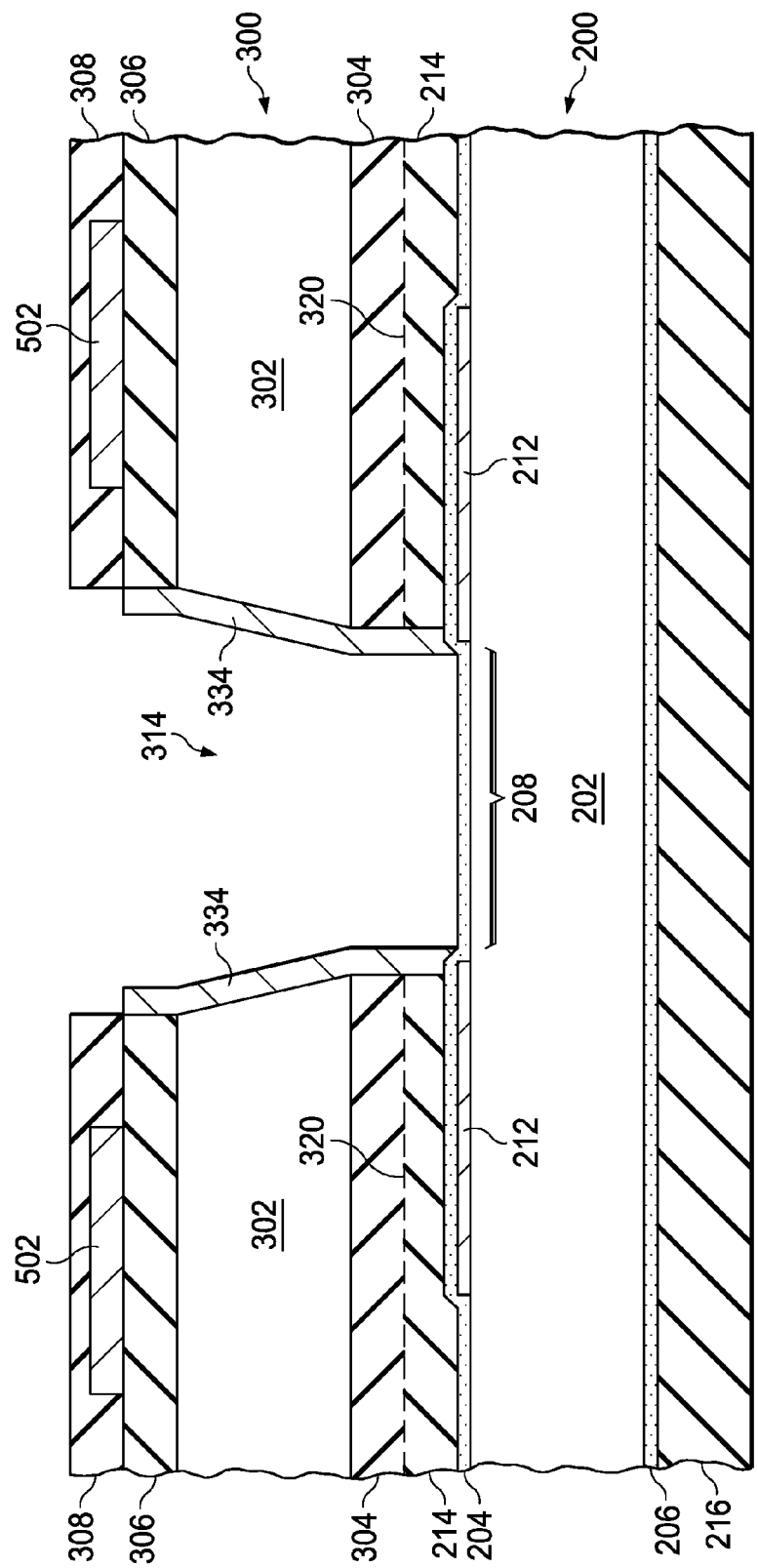

As shown in FIG. 4I, an optional metallization layer 334 may be deposited over the sidewalls of cavities 314. Metallization 334 may be accomplished, for example, using a plating process wherein a metal seed layer is first blanket deposited, then etched to expose layer 208 at the aperture areas 208 at the inner ends of the cavities 314, and then followed by plating metal on top of the seed layer.

Figure 4J:
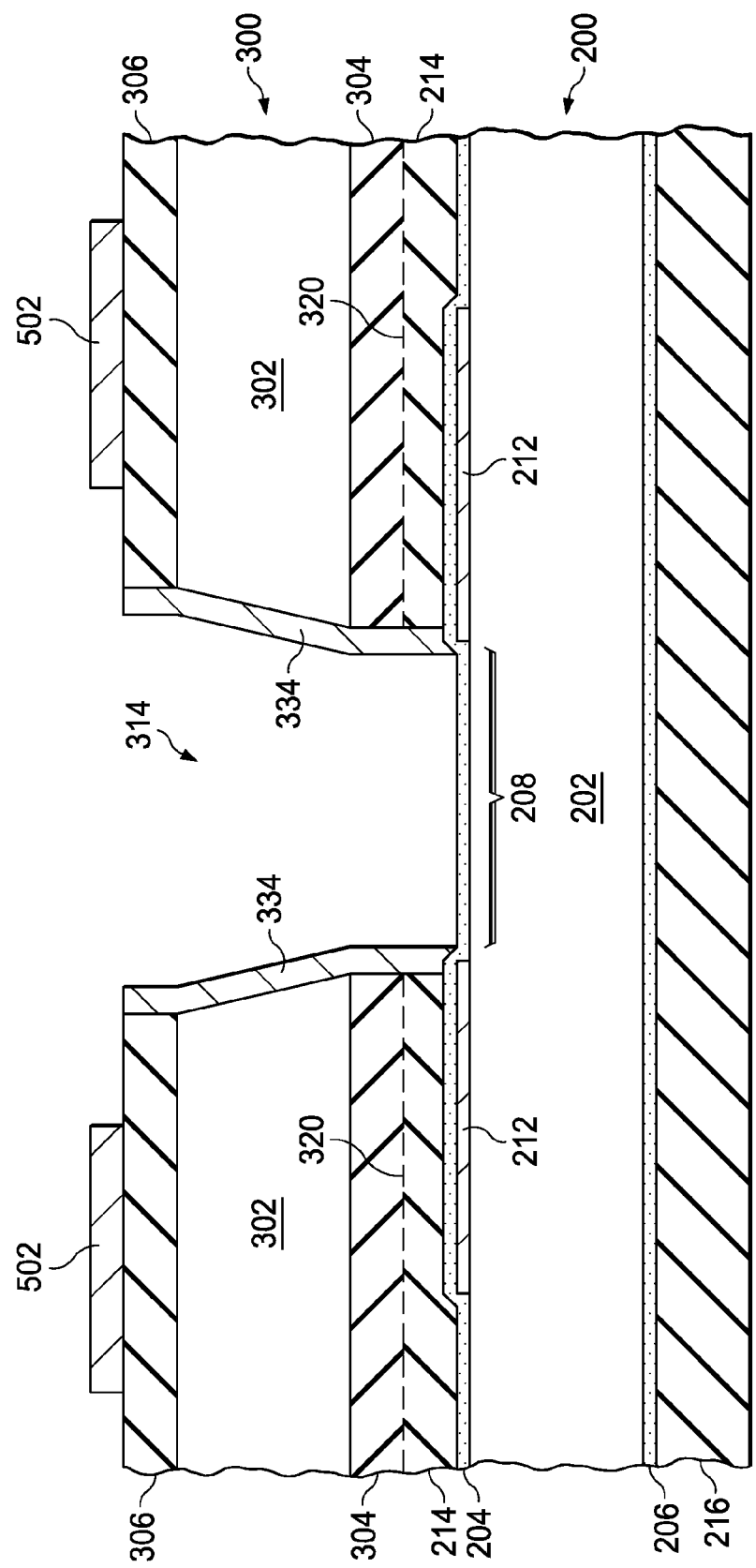
Figure 4K:
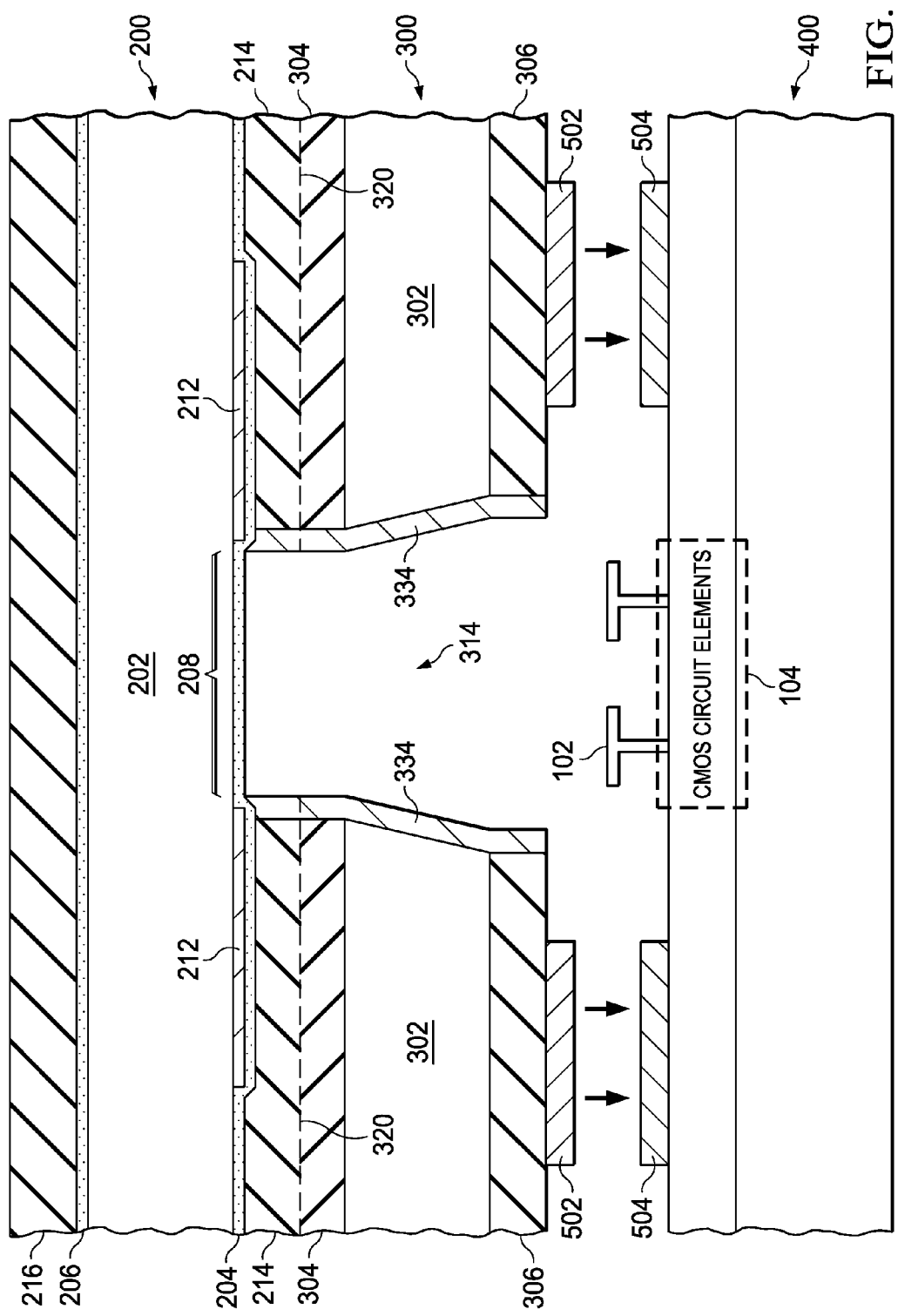

Following completion of the cavities 314, the bottom of the bonded window and interposer wafer structure 200/300 is joined to the top of the MEMS device wafer 400. In preparation for the bonding, in the described specific implementation, remaining portions of protective hardmask layer 308 are stripped away to expose the one or more layers 502 of the sealing structure as indicated in FIG. 4J. (As already mentioned, individual preferences and needs may remove some or all of layer 308 at an earlier or later step.) The lower surface of assembly 200/300 is then aligned and mated with and the upper surface of MEMS device wafer 400 as indicated by the inversion of assembly 200/300 and movement in the direction of the downward arrows shown in FIG. 4K.

As already stated, the bonding of the bonded wafer pair 200/300 to the MEMS wafer 400 may include prior or subsequent deposition of one or more layers 502 on bottom surfaces of structure 200/300 peripherally surrounding cavities 314, and/or prior or subsequent deposition of one or more layers 504 in corresponding locations peripherally surrounding micromechanical elements (viz., micromirror arrays) 102 on top surfaces of MEMS device wafer 400. The bonding process mates the facing surfaces of layers 502, 504 to form hermetically sealed (or, optionally, non-hermetic) protective containments for the elements 102. After the bonding of interposer/window wafer assembly 200/300 to MEMS device wafer 400 is complete, the joint wafer assembly 200/300/400 is singulated to separate the respective encapsulated die regions into discrete packaged MEMS devices, such as shown in FIG. 1.

Modifications are possible in the described embodiments, and other embodiments are possible, within the scope of the claims.

What is claimed is:

1. A method of fabricating a packaged MEMS device, comprising:
    providing an interposer wafer having a silicon substrate with first and second silicon oxide layers respectively thermally grown over top and bottom surfaces of the silicon substrate;
    providing a window wafer having a glass substrate with first and second anti-reflective coatings formed over top and bottom surfaces of the glass substrate;
    forming a third silicon oxide layer over the first anti-reflective coating;
    bonding the interposer and window wafers at the first and third silicon oxide layers;
    selectively etching portions of the second silicon oxide layer down to the silicon substrate to define a first end of a cavity;
    selectively etching portions of the silicon substrate down to the first silicon oxide layer to define the cavity through the semiconductor substrate; and
    selectively etching portions of the first and third silicon oxide layers down to the first anti-reflective coating to define a second end of the cavity, the first anti-reflective coating serving as an etch stop relative to an etchant used to etch the first and third silicon oxide layers.

2. The method of claim 1, wherein the first and second anti-reflective coatings comprise at least one of an alkaline earth Group I or II metal fluoride, a lanthanide metal fluoride or an actinide metal fluoride.

3. The method of claim 2, wherein the anti-reflective coatings comprise at least one of magnesium fluoride ($MgF_2$), yttrium fluoride ($YF_3$) or ytterbium fluoride ($YbF_3$).

4. The method of claim 2, wherein the etchant comprises at least one of a fluorocarbon dry etch or a buffered oxide ($NH_4F/HF$ mixture) wet etch.

5. The method of claim 2, wherein the window wafer further comprises apertures formed over the glass substrate under the third silicon oxide layer.

6. The method of claim 2, further comprising providing a MEMS device wafer having die areas with micromechanical elements and microelectronic elements under the micromechanical elements; and bonding the interposer wafer to the MEMS wafer at locations peripherally of the die areas with the micromechanical elements contained within the cavity.

7. The method of claim 6, wherein selectively etching portions of the silicon substrate down to the first silicon oxide layer defines the cavity with sidewalls that slope inwardly through the silicon substrate in a direction from the first to the second ends.

* * * * *